(12) United States Patent
Chen et al.

(10) Patent No.: US 6,860,592 B2
(45) Date of Patent: Mar. 1, 2005

(54) INKJET CARTRIDGE AND METHOD OF IDENTIFYING COLOR OF INK THEREOF BY FLEXIBLE PRINTED CIRCUIT BOARD

(75) Inventors: Chih-Ching Chen, Taipei (TW); Yi-Jing Leu, Hsinchu (TW)

(73) Assignee: Benq Corporation (TW)

( * ) Notice: Subject to any disclaimer, the term of this patent is extended or adjusted under 35 U.S.C. 154(b) by 162 days.

(21) Appl. No.: 10/253,544

(22) Filed: Sep. 25, 2002

(65) Prior Publication Data

US 2003/0058311 A1 Mar. 27, 2003

(30) Foreign Application Priority Data

Sep. 25, 2001 (TW) ........................................ 90123657 A

(51) Int. Cl.[7] .............................................. B41J 2/175
(52) U.S. Cl. .......................................... 347/86; 347/19
(58) Field of Search ............................ 347/86, 57, 54, 347/19, 22

(56) References Cited

U.S. PATENT DOCUMENTS

| | | | |
|---|---|---|---|
| 5,748,209 A | * | 5/1998 | Chapman et al. ............. 347/50 |
| 6,161,915 A | | 12/2000 | Bolash et al. ................. 347/19 |
| 6,334,660 B1 | * | 1/2002 | Holstun et al. ............... 347/19 |
| 6,409,312 B1 | * | 6/2002 | Mrvos et al. ................. 347/54 |
| 6,431,686 B2 | * | 8/2002 | Saul et al. .................... 347/57 |
| 6,585,347 B1 | * | 7/2003 | Johnson et al. ............... 347/22 |

* cited by examiner

*Primary Examiner*—K. Feggins
(74) *Attorney, Agent, or Firm*—Rabin & Berdo, P.C.

(57) ABSTRACT

An inkjet print cartridge and a method of identifying the colors of ink contained therein by a color flexible PCB are disclosed. The inkjet cartridge includes a casing and a flexible printed circuit board (PCB). The casing has an ink reservoir for containing ink. The flexible PCB, disposed to the casing, includes a flexible substrate, a conductive trace, and a printing ink layer, wherein the flexible substrate has a first surface, and the conductive trace is formed thereon. The printing ink layer is formed on the first surface of the flexible substrate, and the first surface is partially covered by the printing ink layer to bare parts of the conductive trace. Also, at least one identifiable area is formed at the printing ink layer for identification, wherein the color of the identifiable area is associated with the color of ink in the ink reservoir.

33 Claims, 10 Drawing Sheets

INKJET CARTRIDGE AND METHOD OF IDENTIFYING COLOR OF INK THEREOF BY FLEXIBLE PRINTED CIRCUIT BOARD

This application incorporates by reference of Taiwan application Serial No. 90123657, filed Sep. 25, 2001.

BACKGROUND OF THE INVENTION

1. Field of the Invention

The invention relates in general to an inkjet cartridge and a method of identifying the color of ink contained in the cartridge, and more particularly to a method for identifying the colors of ink contained in the cartridge by the color flexible printed circuit board (PCB).

2. Description of the Related Art

The computer printer, particularly the color inkjet printer, has become a necessity in the modern life. It can be used for printing out the desired information such as documents, color pictures, and photos.

Generally, two cartridges are used in the inkjet printer for color printing. One is the black cartridge containing black ink and mostly consumed by printing text documents; the other is the color cartridge containing color inks for printing pictures. Moreover, some types of the inkjet printers are further equipped with the photo-ink cartridges, which can provide abundant hues for printing the high quality photos or pictures. Moreover, the inks with different color are also disposed in the different inkjet cartridges.

FIG. 1 is a partially perspective view of a general inkjet print cartridge. The inkjet print cartridge 150 includes a casing 152, a printhead 154, a printhead chip 156 and a flexible printed circuit board (PCB) 158. There is an ink reservoir 160 in the casing 150 for storing ink (not shown in FIG. 1). The printhead 154, projected out of the bottom of inkjet print cartridge 150. The printhead chip 156 includes a nozzle member comprising two parallel columns of orifices (not shown) formed in the flexible PCB 158. Ink is ejected through the orifices during printing. The flexible PCB 158, attached to the bottom side and back side of the casing 152, is electrically coupled to the printhead chip 156. The printhead chip 156 receives the driving current from the inkjet printer and then makes the cartridge 150 to expel ink. Also, the flexible PCB 158 comprises numerous holes 162, and the dimples of the printer circuit electrically contact with the conductive traces points 164 of the flexible PCB 158 through the holes 162.

Conventionally, the way for the users identifying the color of ink is to read the label 166 posted on the casing 152, or check the color of the lid 168.

The flexible PCB is commonly fabricated by tape automated bonding (TAB) technique. Etching and punching are two typical TAB manufacturing processes. Etching process is characterized by etching the tape while the punching process is characterized by punching the tape to form the holes of the flexible PCB. The details are illustrated in the following description.

FIG. 2A~FIG. 2J illustrate a conventional etching process for forming the holes of the flexible printed circuit board. First, a substrate 102 such as the material of polyimide (PI) is provided, as shown in FIG. 2A. A copper film 104 is then formed over the substrate 102 by sputtering, as shown in FIG. 2B. Two layers of photo-resist (PR) 106 are formed respectively on the bottom side of the substrate 102 and over the copper film 104, as shown in FIG. 2C. After exposing (FIG. 2D) and developing (FIG. 2E) the two layers of PR 106, the predetermined patterns of the holes and the conductive traces are defined. Next, a copper layer 108 is plated on the exposed copper film 104, and the copper layer 108 and the copper film 104 are integrated as a whole, as shown in FIG. 2F. Then, the substrate 102 is partially etched to form the holes 110, as shown is FIG. 2G. The remaining photo-resist 106 on the both sides are then removed, as shown in FIG. 2H. The copper layer 108 and the copper film 104 are exposed to air, and several gaps 109 are formed on the copper layer 108.

Afterward, the portion of the copper film 104 not covered by the copper layer 108 is removed by photolithography through the steps of coating a layer of PR, exposing, developing and etching. The conductive traces 111 are therefore formed by the combination of the remaining copper film 104 and the copper layer 108, as shown in FIG. 2I. Finally, the conductive trace 111 is enclosed by an insulation layer 112 for the purpose of protection, and the flexible PCB 114 is finished as shown in FIG. 2J. The conventional etching process has several drawbacks, including large time-consumption and low yield rate (high proportion of low-quality product). Also, it produces a sticky precipitate and discharges large amounts of wastewater during etching process. The cost of wastewater treatment and environmental pollution are considerable issues.

FIG. 3A~FIG. 3I illustrate the conventional punching process for forming the holes of the flexible printed circuit board. First, a substrate 202 is provided (FIG. 3A), and an adhesive layer 204 is coated thereon, as shown in FIG. 3B. Then, the substrate 202 coated with the adhesive layer 204 is punched by the punching tool to form several holes 206, as shown in FIG. 3C. A copper layer 208 is further attached over the adhesive layer 204, as shown in FIG. 3D. Next, a photo-resist layer 210 is formed on the copper layer 208, followed by exposure and development. Numerous gaps 211 are created so as to expose parts of the copper layer 208 to the air, as shown in FIG. 3G. Then, portions of the copper layer 208 not covered by the PR layer 210 are etched, as shown in FIG. 3H.

Afterward, the remaining PR layer 210 is removed, and the discrete copper layer 208 (FIG. 3I) therefore forms the conductive traces. Finally, the conductive trace is enclosed by an insulation layer 212 for the purpose of protection, and then the flexible PCB 214 is completed as shown in FIG. 3I. Compared with the etching process mentioned above, the punching process is a short-term procedure requiring less cost and no wastewater treatment. However, the interval between adjacent holes is too wide to form a large number of holes of the flexible PCB. Consequently the contact area between the printer and the flexible PCB is decreased, and dramatically affects the precision of contact. Furthermore, the punching step could easily cause the breakage of the substrate, thus reducing the yield rate and increasing the cost of production.

Additionally, in the commercial inkjet printer market, there are some kinds of color-separate inkjet print cartridges filled with black ink or color ink, such as cyan ink, magenta ink, yellow ink, light black ink, light cyan ink, light magenta ink and light yellow ink. However, only two conventional methods are used for the identification of color of the ink. That is, if an inkjet print cartridge contains two or more colors of ink, it could be identified either by the colors of lids, marks, or by a label to signify the colors of ink.

SUMMARY OF THE INVENTION

It is therefore an object of the invention to provide an inkjet cartridge and a method of identifying the color of ink contained in the inkjet cartridge by the color flexible printed circuit board (PCB), so that the users can easily and quickly identify the ink colors of the inkjet cartridge.

It is an object of the invention to provide an inkjet cartridge, including a casing and a flexible PCB. The casing has an ink reservoir for containing at least one kind of ink. The flexible PCB, disposed to the casing, includes a flexible substrate, a plurality of conductive traces, and a printing ink layer. The flexible substrate has a first surface, and the conductive traces are formed thereon. The printing ink layer is formed on the first surface of the flexible substrate, and bares parts of the conductive traces. Also, at least one identifiable area is formed at the printing ink layer for identification, wherein the color of the identifiable area is associated with the color of ink stored in the ink reservoir.

It is another object of the invention to provide a method of identifying the colors of ink contained in the inkjet cartridge by a color flexible PCB. First, at least one inkjet cartridge is provided. The cartridge includes a casing and a flexible PCB. The casing has an ink reservoir for containing at least one kind of ink. The flexible PCB, disposed to the casing, includes a flexible substrate, a plurality of conductive traces, and a printing ink layer. The flexible substrate has a first surface, and the conductive layer is formed thereon. The printing ink layer is formed on the first surface of the flexible substrate, and bares parts of the conductive traces. Also, at least one identifiable area is formed at the printing ink layer for identification. Second, the ink reservoir is filled with at least one color kind of ink, wherein the color of the identifiable areas is associated with the color of ink stored in the inkjet cartridge.

It is a further object of the invention to provide an identifiable flexible PCB disposed to the inkjet cartridge. The cartridge has an ink reservoir to contain at least one kind of ink. The flexible PCB includes a flexible substrate, a plurality of conductive traces, and a printing ink layer. The flexible substrate has a first surface, and the conductive traces are formed thereon. The printing ink layer is formed on the first surface of the flexible substrate, and bares parts of the conductive trace. Also, at least one identifiable area is formed at the printing ink layer for identification. The color of the identifiable areas is associated with the color of ink stored in the inkjet cartridge.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, an inkjet print cartridge with particular design is disclosed. The inkjet print cartridge includes a casing and a flexible printed circuit board (PCB). Also, an ink reservoir is further formed in the casing for storing ink. The flexible PCB, attached on the outer surface of the casing, comprises a flexible substrate, a conductive layer and a printing ink layer, wherein the preferred material of the printing ink layer is a liquid photo imagerable polymer. The conductive layer are formed over a surface of the flexible substrate, and the surface is partially covered by the printing ink layer to bare part of conductive layer thus form the conductive traces.

Additionally, at least one identifiable area is formed at the printing ink layer, and the color revealed in the identifiable area is associated with the color of ink stored in the inkjet cartridge. This color flexible PCB provides a quick way for the users to identify the colors of ink in the inkjet cartridge. The details of the structure of flexible PCB and the manufacturing process thereof are described as follows.

Figure 1:
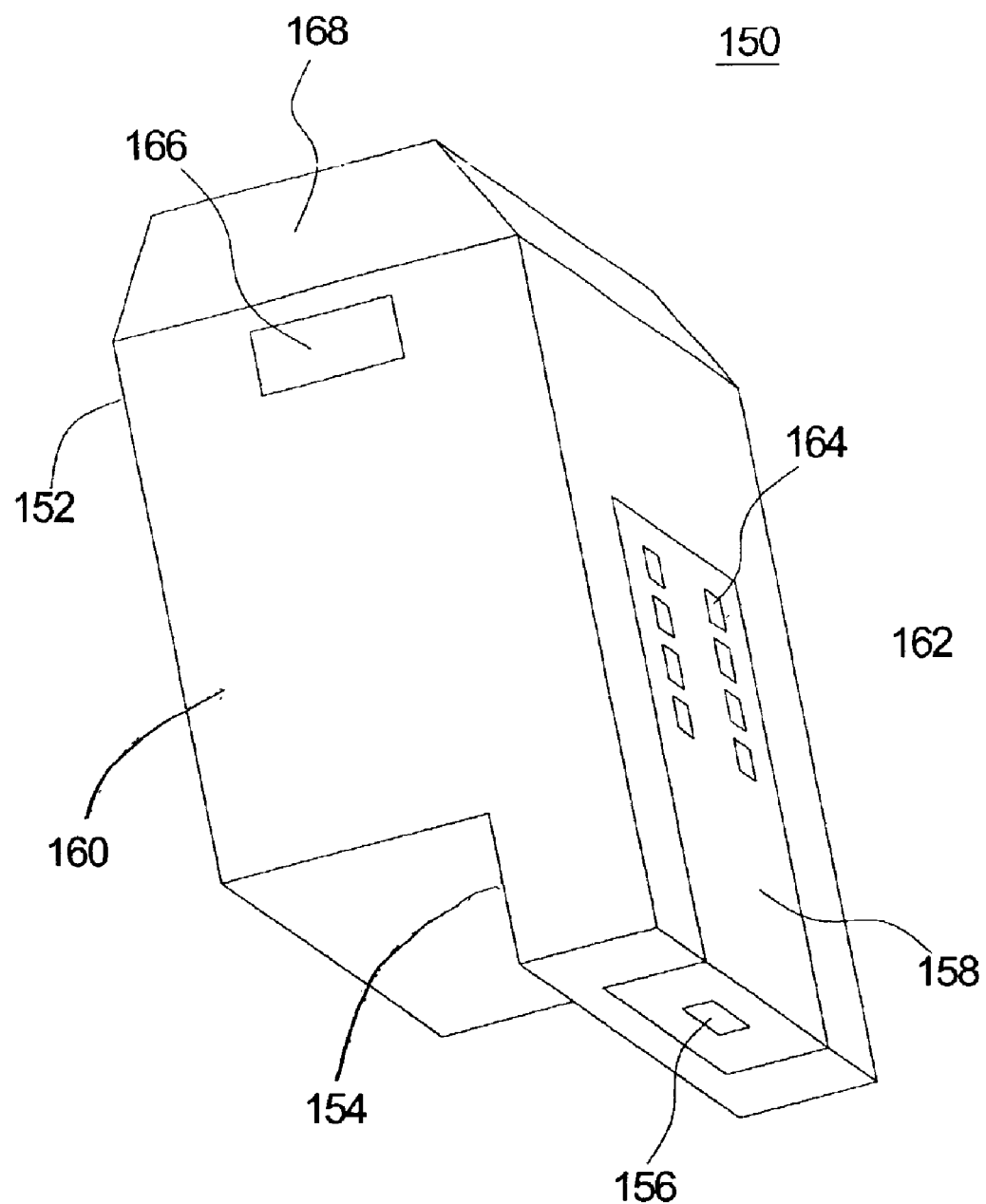
FIG. 1 is a partially perspective view of a general inkjet print cartridge.
Figure 2A:
FIG. 2A~FIG. 2J (Prior Art) illustrate a conventional etching process for forming the holes of the flexible printed circuit board.
Figure 2B:
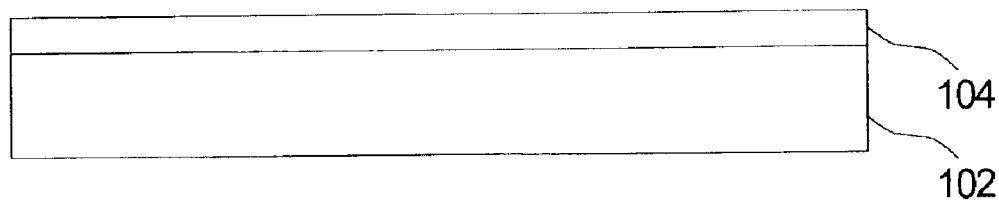
Figure 2C:
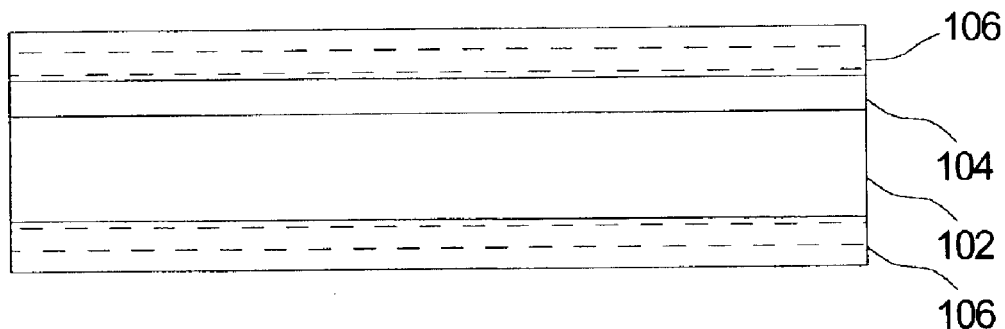
Figure 2D:
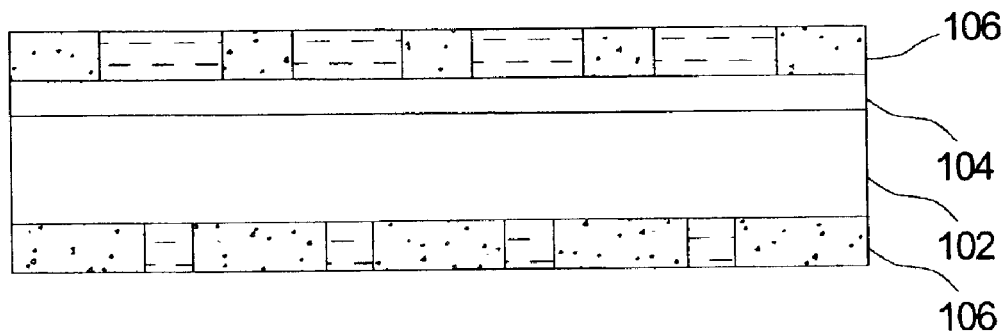
Figure 2E:
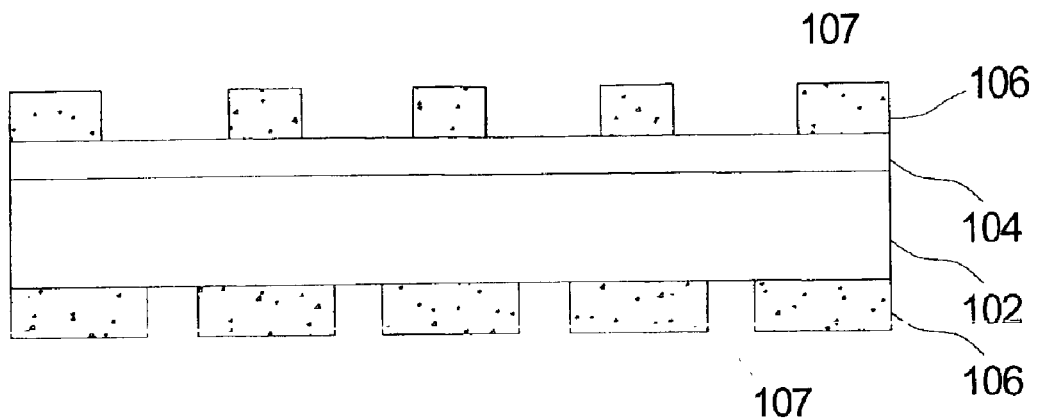
Figure 2F:
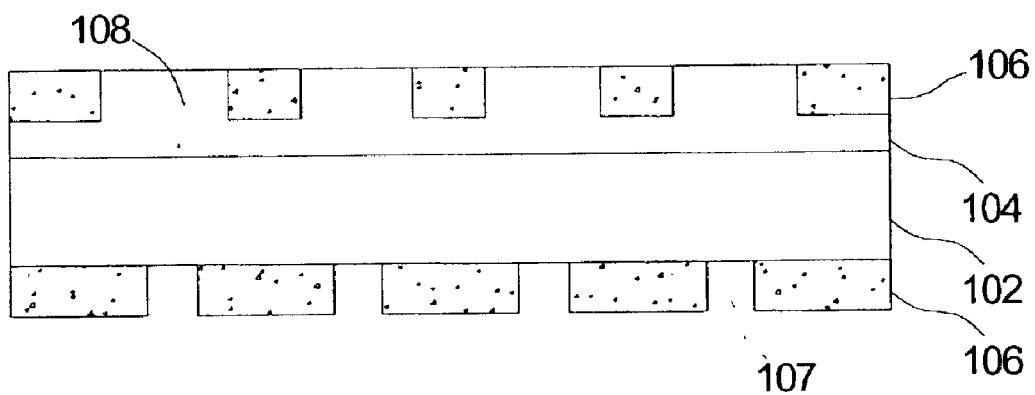
Figure 2G:
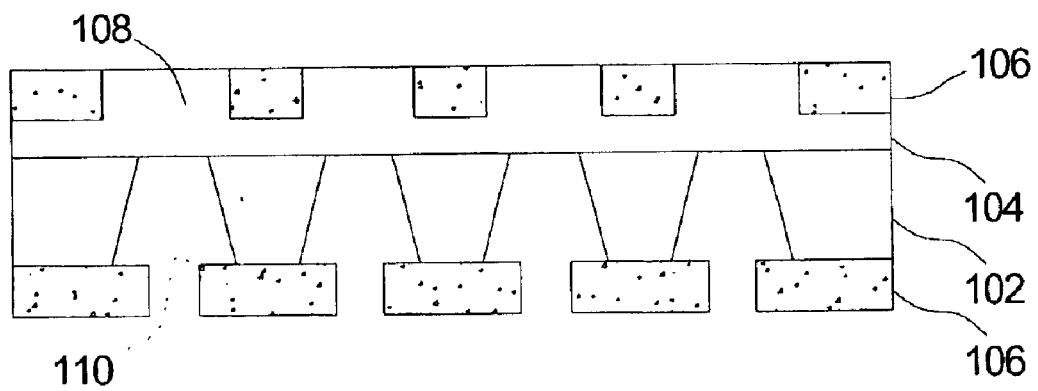
Figure 2H:
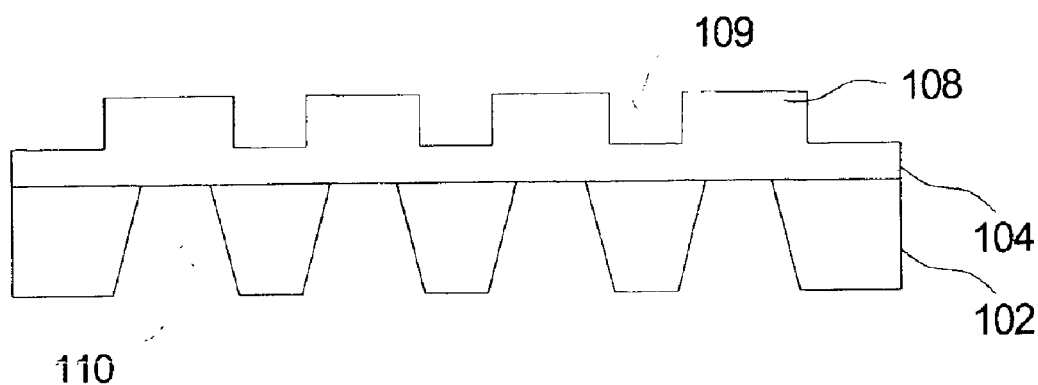
Figure 2I:
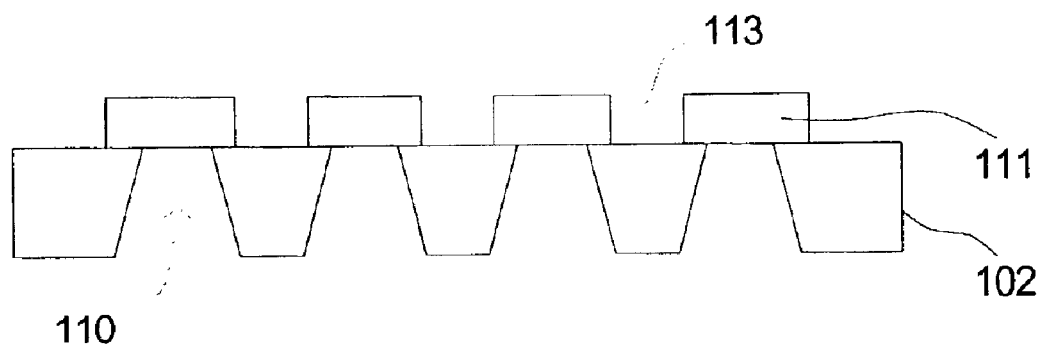
Figure 2J:
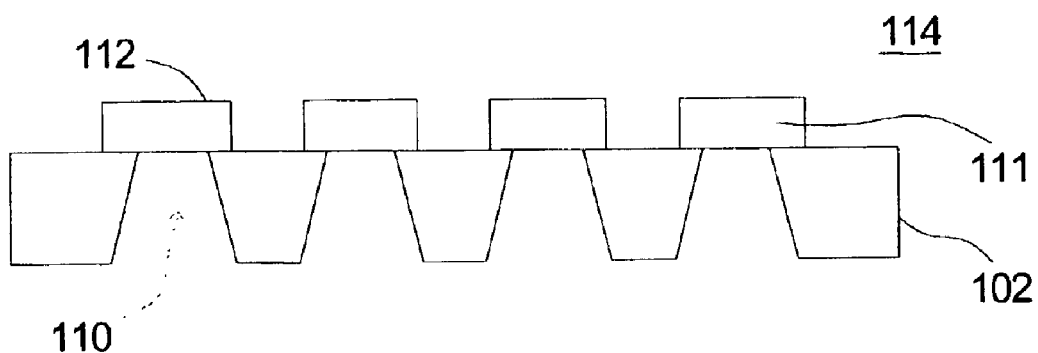
Figure 3A:
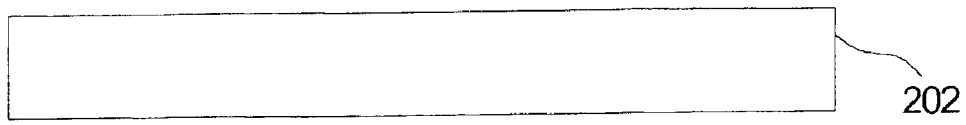
FIG. 3A~FIG. 3I (Prior Art) illustrate the conventional punching process for forming the holes of the flexible printed circuit board.
Figure 3B:
Figure 3C:
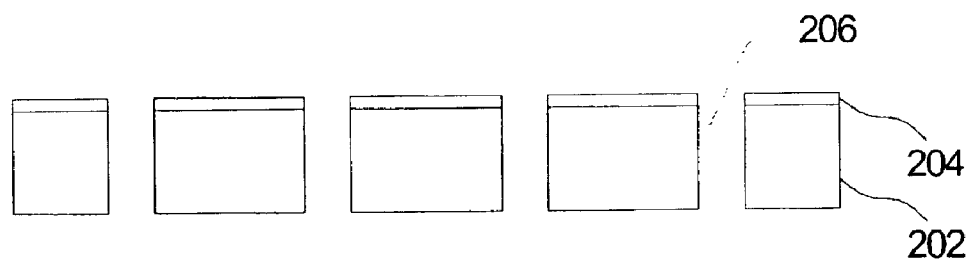
Figure 3D:
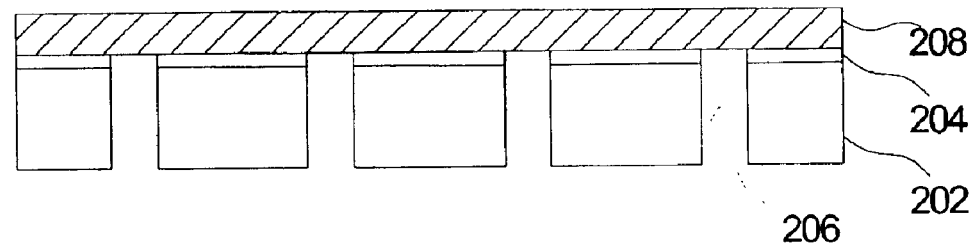
Figure 3E:
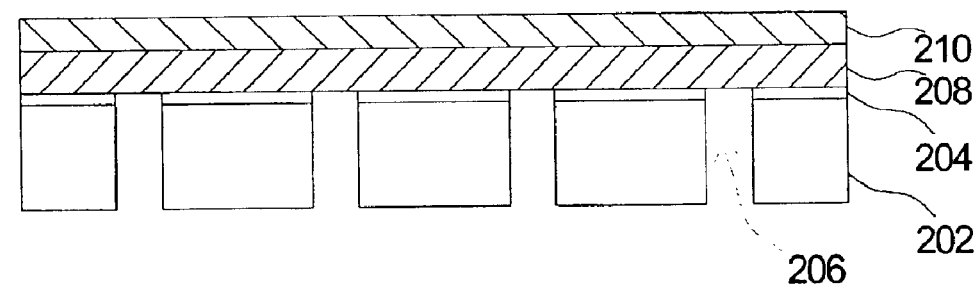
Figure 3F:
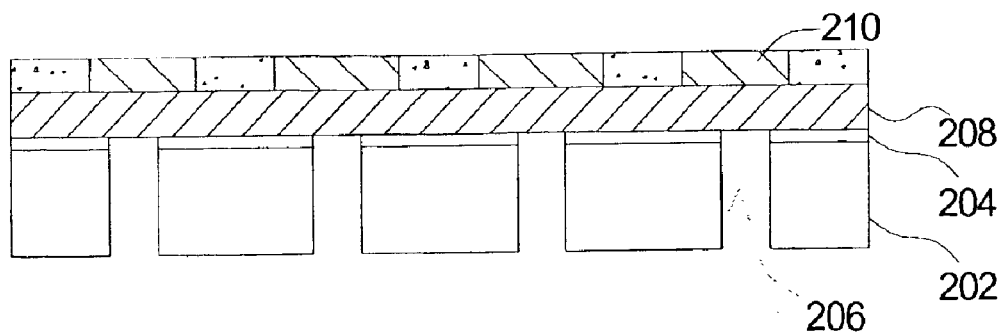
Figure 3G:
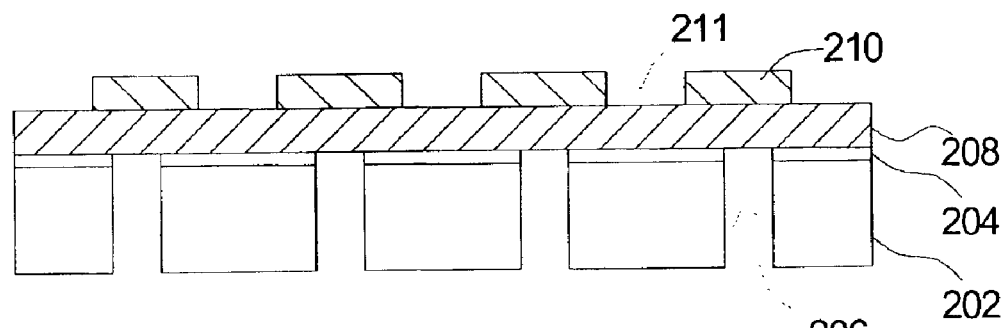
Figure 3H:
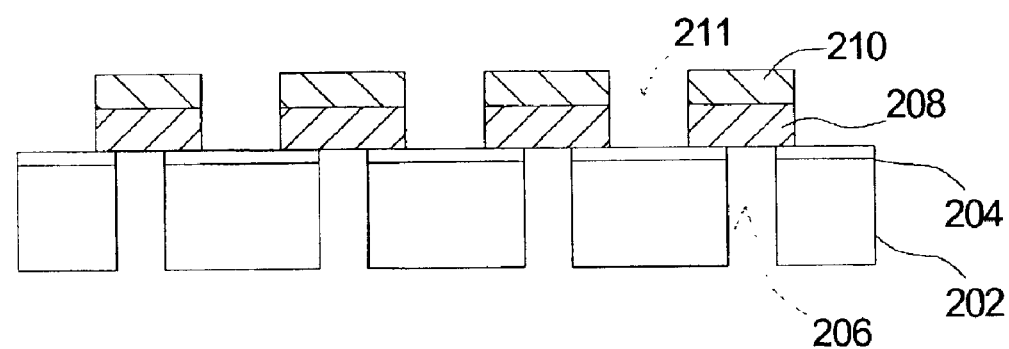
Figure 3I:
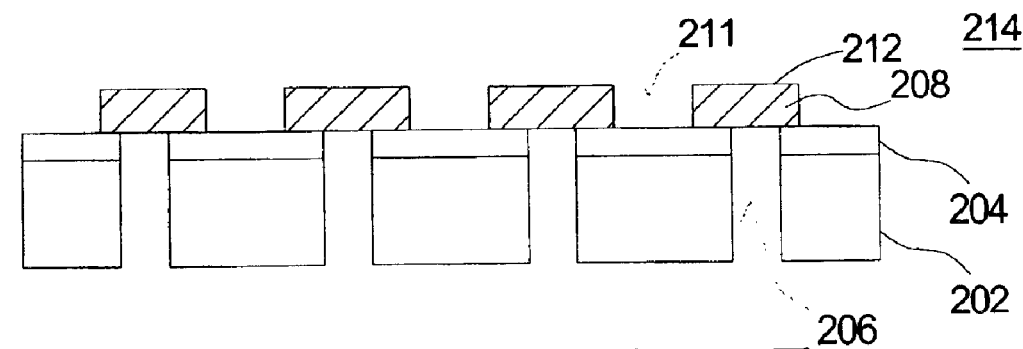
Figure 4A:
FIG. 4A~FIG. 4J illustrate the process of fabricating the flexible printed circuit board of the invention.

FIG. 4A~FIG. 4J illustrate the process of fabricating the flexible printed circuit board of the invention. First, a flexible substrate 302 such as the material of polyimide (PI) is provided, as shown in FIG. 4A. In addition to the material of polyimide, the material of the flexible substrate 302 can be other polymer film such as Teflon, polyamide, polymethylmethacrylate, polycarbonate, polyester, polyamide polyethylene-terephthalate copolymer, or any combination of the above materials.

Figure 4B:
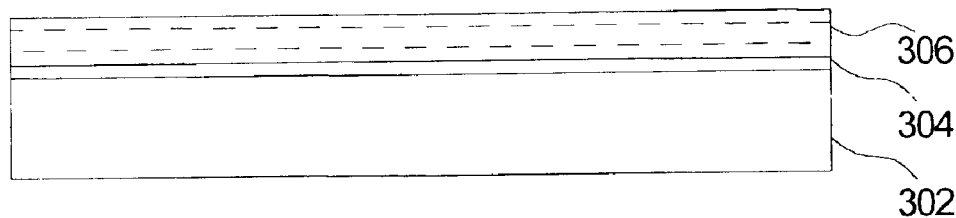
Figure 4C:
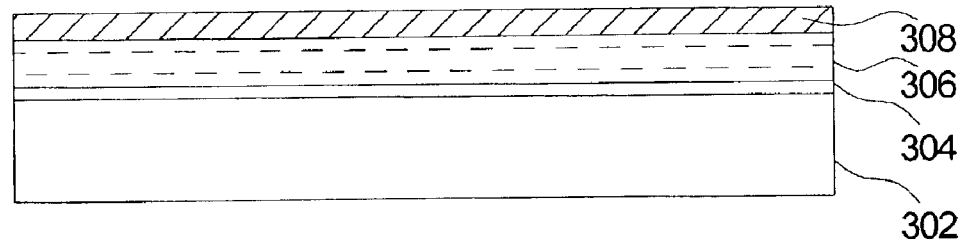
Figure 4D:
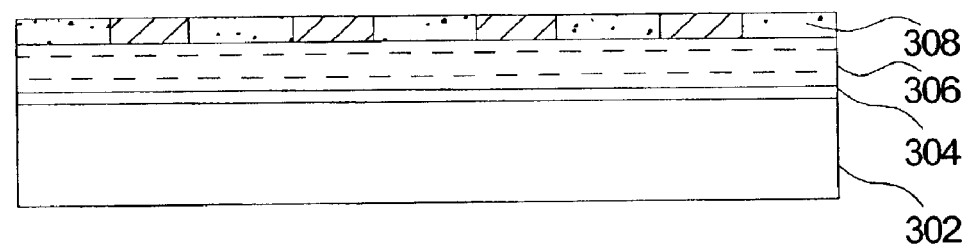
Figure 4E:
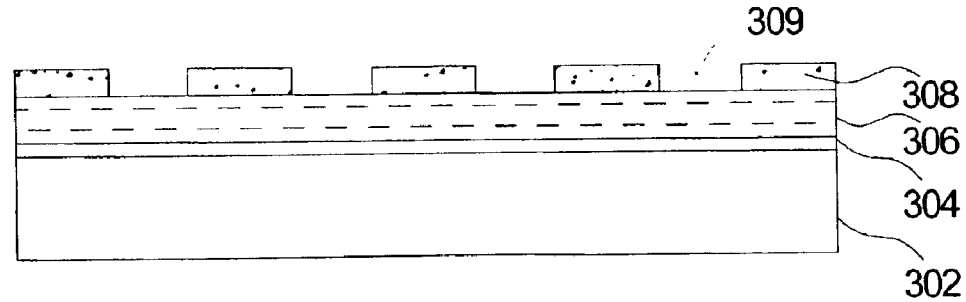
Figure 4F:
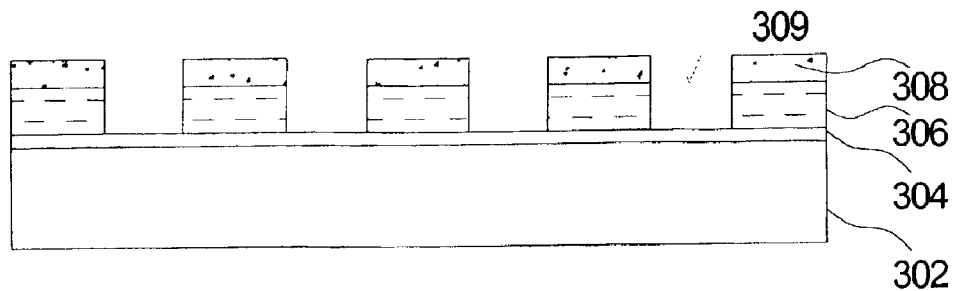
Figure 4G:
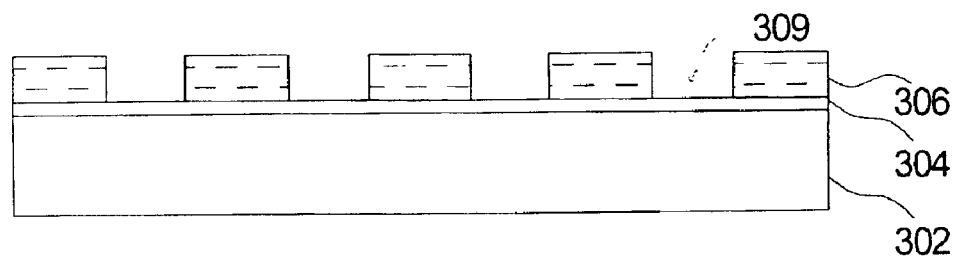

Next, a conductive layer 306 is attached to the top surface of the flexible substrate 302 through an adhesive layer 304, as shown in FIG. 4B. The material of the conductive layer 306 can be a roll of copper foil or gold foil, and is attached to the flexible substrate 302 to form the conductive traces. The copper foil or the gold foil is preferably about 10 m to 50 m thick. Then, a photo-resist (PR) layer 308 is formed over the conductive layer 306, as shown in FIG. 4C. After exposing (FIG. 4D) and developing (FIG. 4E) the PR layer 308, the predetermined pattern of the conductive traces is defined. In FIG. 4E, several gaps 309 are created between the discrete PR layer 308, so as to expose portions of the conductive layer 306 to air. The conductive layer 306 not covered by the PR layer 308 is etched, resulting in the formation of deeper gaps 309 and exposure of partial adhesive layer 304 to the air, as shown in FIG. 4F. Then, the remaining PR layer 308 is removed, and the conductive layer 306 formed as the predetermined pattern is exposed to the air, as shown in FIG. 4G.

Figure 4H:
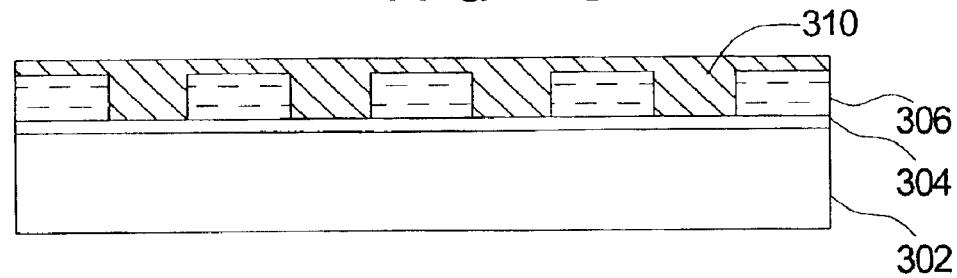

Afterward, a printing ink layer 310 is coated over the top surface of the flexible substrate 302. The printing ink layer 310 covers not only the adhesive layer 304 but also the conductive layer 306, as shown in FIG. 4H. This is a critical step for fabricating the flexible PCB of the present invention. According to the invention, at least one colorant is added in the printing ink layer 310 to form the identifiable area. The added colorant depends on the associated ink color stored in the inkjet cartridge; thereby the users can quickly know the color of ink in the inkjet cartridge by checking the identifiable (color) area.

To accommodate the purpose of identification, the colorant added in the printing ink layer 310 could be the same color as ink in the inkjet cartridge, such as black color, cyan color, magenta color, yellow color, light black color, light cyan color, light magenta color, and light yellow color. Also, the added colorant could the other color relevant to the unusual color of inks, such as orange, green, light orange, and light green. Furthermore, the preferred material of the printing ink layer 310 is a liquid photo imagerable polymer, such as liquid photo imagerable solder mask (LPSM) or polyimide (PI). After exposure to light, the LPSM is cross-linked and the strengthened structure does not dissolved in the developer. The other photo-resist such as polyimide (PI) functions the same as LPSM. Also, the printing ink layer 310 could be coated by screening printing, spray coating, curtain coating, or roller coating.

Figure 4I:
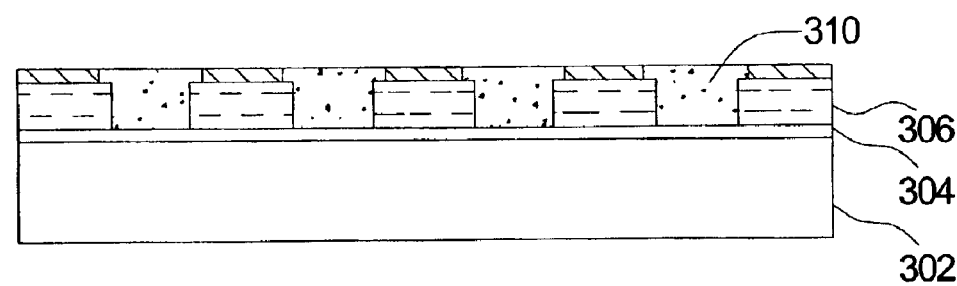
Figure 4J:
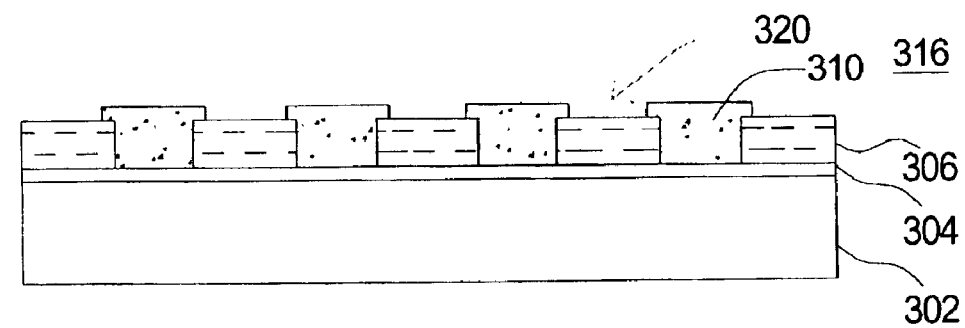

Next, after exposing the printing ink layer 310, a predetermined pattern is formed thereon, as shown in FIG. 4I. Afterward, the partial printing ink layer 310 is removed by developing. As shown in FIG. 4J, several holes 320 are formed between the discrete blocks of the printing ink layer 310, resulting in the exposure of the conductive layer 306. The dimples of the printer circuit electrically contact with the conductive traces (on the conductive layer) of the flexible PCB 316 through the holes 320. By repeating the steps of FIG. 4H to FIG. 4J and adding different color of colorants into the printing ink layer 310, the flexible PCB 316 with different kinds of color can be obtained. Then, the remaining printing ink layer 310 is hardened by post-curing, and the fabrication of the flexible PCB 316 of the invention is completed.

In the description above, the holes 320 of the flexible substrate 302 are not formed by punching. Therefore, the fabricating method of forming the flexible PCB has several advantages; for example, the cycle time is shortened, the resolution of printer is increased, and the production yield is raised to about 99%. Accordingly, the invention is very suitable for a mass-production scale.

The inkjet print cartridge of the invention, which has identifiable flexible PCB attached thereon, will be further explained in detail with reference to the following examples.

First Embodiment

Figure 5:
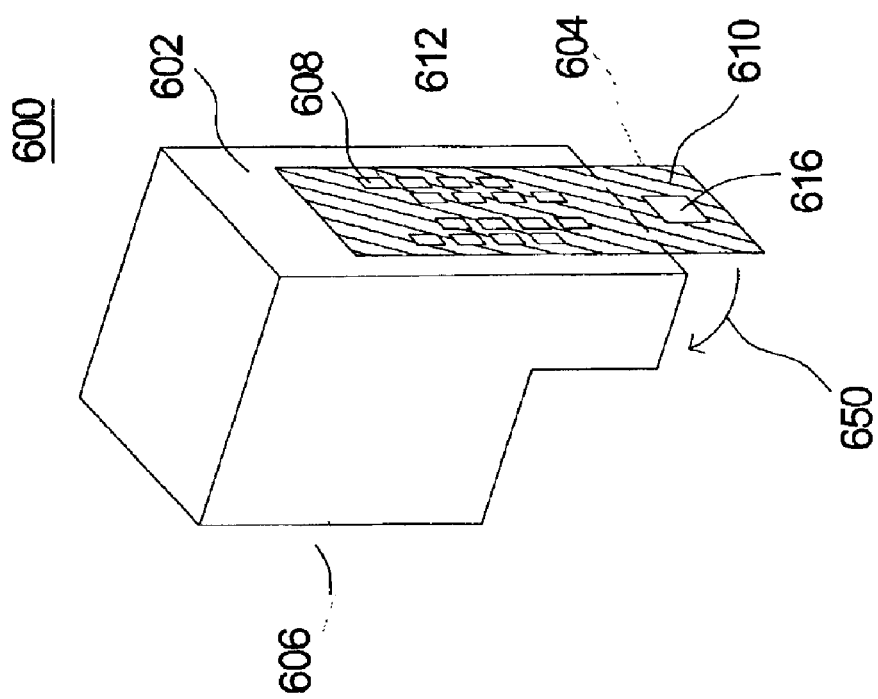
FIG. 5 is a perspective drawing of an inkjet print cartridge according to the first embodiment of the invention.

FIG. 5 is a perspective drawing of an inkjet print cartridge according to the first embodiment of the invention. The inkjet print cartridge 600 at least comprises a casing 602 and a flexible PCB 604. There is an ink reservoir 606 inside the casing 602 for containing a color of ink (not shown), such as red ink. The flexible PCB 604 is attached on one side of the casing 602. The lower end of the flexible PCB 604, having a chip-coupling area 616, bends inward (along the direction of arrow 650) so as to couple with the printhead chip (not shown) in the bottom side of the casing 602.

According to the foregoing fabrication of the present invention, the flexible PCB 604 includes a flexible substrate (not shown in FIG. 5), the conductive trace points 608, and a printing ink layer 610. For contacting the dimples of the printer circuit, the conductive trace points 608 are exposed to the air through the holes 612. In this embodiment, only one colorant, such as red colorant, is added to dye the entire printing ink layer 610 during fabrication. In other words, the size of the identifiable area is identical to that of the entire printing ink layer 610. The added colorant is optional, depending on the color of ink in the associated cartridge. After assembling the flexible PCB 604 to the cartridge 600, the color of ink in the ink reservoir 606 can be quickly and easily identified by looking at the color of the printing ink layer 610 of the flexible PCB 604.

Second Embodiment

Figure 6:
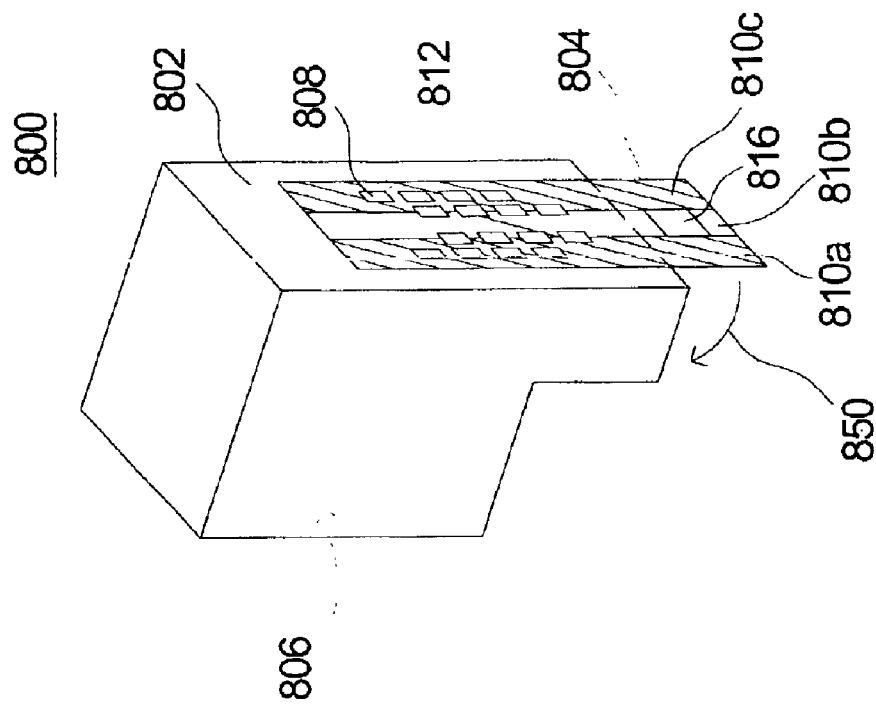
FIG. 6 is a perspective drawing of an inkjet print cartridge according to the second embodiment of the invention.

FIG. 6 is a perspective drawing of an inkjet print cartridge according to the second embodiment of the invention. The inkjet print cartridge 800 includes a casing 802 and a flexible PCB 804. There is an ink reservoir 806 inside the casing 802 for containing at least two different colors of ink (not shown), for example, red ink, yellow ink, and cyan ink. The flexible PCB 804 is attached on one side of the casing 802. The lower end of the flexible PCB 804, having a chip-coupling area 816, bends inward (along the direction of arrow 850) so as to couple with the printhead chip (not shown) in the bottom side of the casing 802.

According to the foregoing fabrication of the present invention, the flexible PCB 804 includes a flexible substrate (not shown), the conductive trace points 808, and the identifiable areas 810a, 810b and 810c of the printing ink layer. For contacting the dimples of the printer circuit, the conductive trace points 808 formed on the flexible substrate are exposed to the air through the holes 812. Additionally, three different colorants, such as red colorant, yellow colorant and cyan colorant, are respectively added to the printing ink layer, to form three identifiable areas 810a, 810b and 810c. After assembling the flexible PCB 804 to the cartridge 800 containing red ink, yellow ink and cyan ink, the colors of ink in the ink reservoir 806 can be quickly, and easily identified.

Third Embodiment

Figure 7:
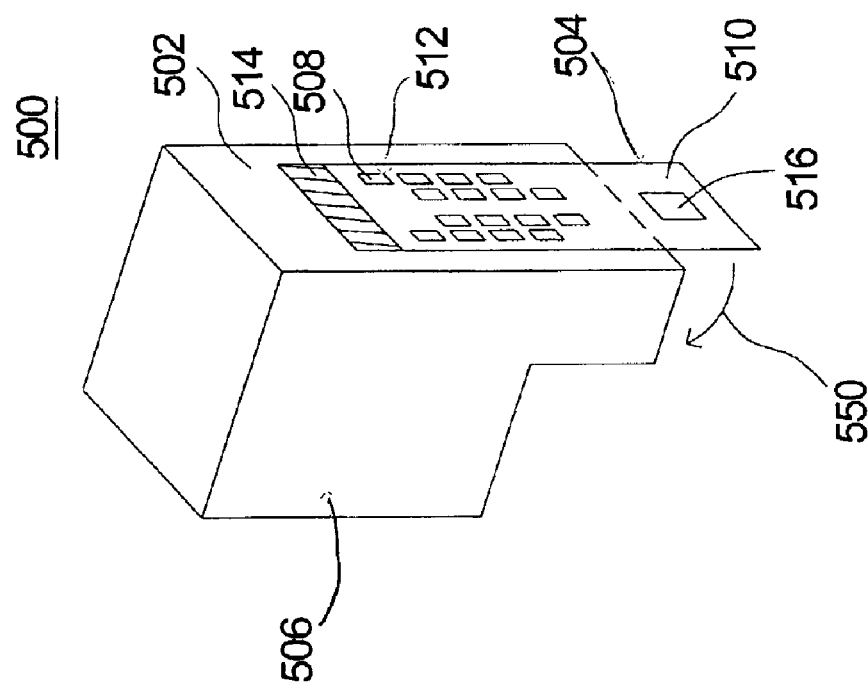
FIG. 7 is a perspective drawing of an inkjet print cartridge according to the third embodiment of the invention.

FIG. 7 is a perspective drawing of an inkjet print cartridge according to the third embodiment of the invention. The inkjet print cartridge 500 includes a casing 502 and a flexible PCB 504. There is an ink reservoir 506 inside the casing 502 for containing a color of ink (not shown), for example, red ink. The flexible PCB 504 is attached on one side of the casing 502. The lower end of the flexible PCB 504, having a chip-coupling area 516, bends inward (along the direction of arrow 550) so as to couple with the printhead chip (not shown) in the bottom side of the casing 502.

According to the foregoing fabrication of the present invention, the flexible PCB 504 includes a flexible substrate 510, the conductive trace points 508, and a printing ink layer having the identifiable area 514. For contacting the dimples of the printer circuit, the conductive trace points 508 formed on the flexible substrate 510 are exposed to the air through the holes 512. In this embodiment, only one colorant, such as red colorant, is added to dye part of the printing ink layer 610 during fabrication, and the small size of identifiable area 514 is formed thereon.

Additionally, another printing ink layer could be further coated on the top end of the flexible PCB 504 to form the identifiable area 514. The added colorant is optional, depending on the color of ink in the associated cartridge. After assembling the flexible PCB 504 to the cartridge 500, the color of ink in the ink reservoir 506 can be quickly, and easily identified by looking at the color of the identifiable area 514.

Fourth Embodiment

Figure 8:
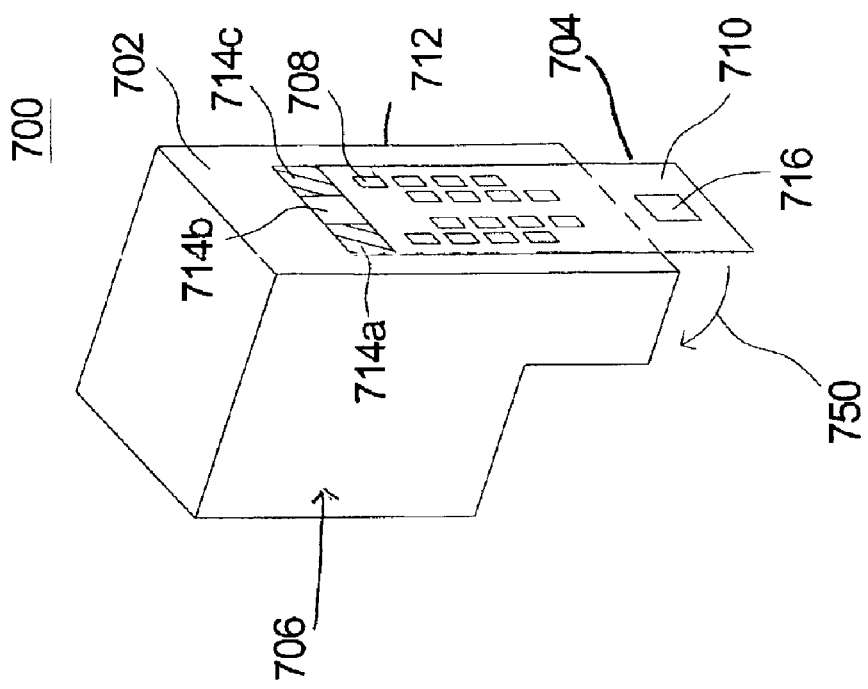
FIG. 8 is a perspective drawing of an inkjet print cartridge according to the fourth embodiment of the invention.

FIG. 8 is a perspective drawing of an inkjet print cartridge according to the fourth embodiment of the invention. The inkjet print cartridge 700 includes a casing 702 and a flexible PCB 704. There is an ink reservoir 706 inside the casing 702 for containing at least two different colors of ink (not shown), for example, red ink, yellow ink, and cyan ink. The flexible PCB 704 is attached on one side of the casing 702. The lower end of the flexible PCB 704, having a chip-coupling area 716, bends inward (along the direction of arrow 750) so as to couple with the printhead chip (not shown) in the bottom side of the casing 702.

The flexible PCB 704 includes a flexible substrate 710, the conductive trace points 708, and the identifiable areas 714a, 714b and 714c of the printing ink layer. For contacting the dimples of the printer circuit, the conductive trace points 708 formed on the flexible substrate 710 are exposed to the air through the holes 712. In this embodiment, three different colorants, such as red colorant, yellow colorant and cyan colorant, are respectively added to dye part of the printing ink layer during fabrication, and the small size of identifiable areas 714a, 714b and 714c are formed thereon.

Additionally, another method of forming the identifiable areas 714a, 714b and 714c is to coat a further printing ink layer on the top end of the flexible PCB 704, wherein the colorants added in the further printing ink layer are optional, depending on the colors of ink in the associated cartridge. After assembling the flexible PCB 704 to the cartridge 700, the colors of ink in the ink reservoir 706 can be quickly, and easily identified by looking at the colors of the identifiable areas 714a, 714b and 714c.

According to the aforementioned descriptions, the method of identifying the color of ink contained in the cartridge by the color flexible PCB, comprises the steps as follows. First, at least one inkjet print cartridge is provided, wherein the cartridge includes a casing and a flexible PCB. An ink reservoir is further formed inside the casing, and the flexible PCB attached on one side of the casing. Also, the flexible PCB is laminated, including a flexible substrate, a conductive layer and a printing ink layer. The conductive layer are formed over a surface of the flexible substrate, which the surface is partially covered by the printing ink layer to bare part of conductive layer and thus form the conductive traces. Besides, at least one identifiable area is formed at the printing ink layer by adding the colorants. Second, at least one kind of ink is provided and filled in the ink reservoir, wherein the color of ink is associated with the color of identifiable area. This method of the invention gives the users one quick and easy way to identify the color of ink contained in the cartridge.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An inkjet print cartridge, comprising:
    a casing, having an ink reservoir for containing N (N is integer) kinds of ink with different colors; and
    a flexible printed circuit board (PCB), assembled to the casing, comprising:
        a flexible substrate having a first surface;
        a conductive trace formed over the first surface of the flexible substrate; and
        a printing ink layer formed on the first surface of the flexible substrate, the first surface partially covered by the printing ink layer to bare part of conductive layer, and N (N is integer) kinds of identifiable areas are formed at the printing ink layer, wherein the colors of the identifiable areas are associated with the colors of ink in the ink reservoir".

2. The inkjet print cartridge according to claim 1, wherein the colors of the identifiable areas are presented by adding N (N is integer) kinds of colorants into the printing ink layer.

3. The inkjet print cartridge according to claim 1, wherein N equals 1.

4. The inkjet print cartridge according to claim 1, wherein N equals 3.

5. The inkjet print cartridge according to claim 1, wherein the colors of the identifiable areas are respectively identical to the colors of ink.

6. The inkjet print cartridge according to claim 1, wherein the material of the printing ink layer is a liquid photo imagerable polymer.

7. The inkjet print cartridge according to claim 6, wherein the liquid photo imagerable polymer is solder mask.

8. The inkjet print cartridge according to claim 6, wherein the liquid photo imagerable polymer is polyimide (PI).

9. The inkjet print cartridge according to claim 1, wherein the printing ink layer is formed on the first surface of the flexible substrate by the steps of coating, exposing, developing and curing.

10. The inkjet print cartridge according to claim 9, wherein the printing ink layer is coated by a method selected from the group consisting of screening printing, spray coating, curtain coating, and roller coating.

11. The inkjet print cartridge according to claim 1, wherein the colors of ink are selected from the groups consisting of black, cyan, magenta, yellow, light black, light cyan, light magenta, light yellow, orange, green, light orange, and light green.

12. A method of identifying the colors of ink contained in an inkjet cartridge by a color flexible PCB, comprising the steps of:
    providing at least one inkjet cartridge, the inkjet cartridge comprising:
        a casing, having an ink reservoir for containing N (N is integer) kinds of ink with different colors; and
        a flexible printed circuit board (PCB), disposed to the casing, a method of forming the flexible PCB comprising the steps:
            providing a flexible substrate having a first surface;
            forming a conductive layer over e first surface of the flexible substrate; and
            forming a printing ink layer on the first surface, the first surface partially covered by the printing ink layer to bare part of conductive layer, and N (N is integer) kinds of identifiable areas are formed at the printing ink layer; and
    providing at least N (N is integer) kinds of ink to the ink reservoir, wherein N kinds of ink have different colors, and the colors of the identifiable areas are associated with the colors of ink.

13. The method according to claim 12, wherein the colors of the identifiable areas are presented by adding N (N is integer) kinds of colorants to the printing ink layer.

14. The method according to claim 12, wherein N equals 1.

15. The method according to claim 12, wherein N equals 3.

16. The method according to claim 12, wherein the colors of the identifiable areas are respectively identical to the colors of ink.

17. The method according to claim 12, wherein the material of the printing ink layer is a liquid photo imagerable polymer.

18. The method according to claim 17, wherein the liquid photo imagerable polymer is solder mask.

19. The method according to claim 17, wherein the liquid photo imagerable polymer is polyimide (PI).

20. The method according to claim 12, wherein the printing ink layer is formed on the first surface of the flexible substrate by the steps of coating, exposing, developing and curing.

21. The method according to claim 20, wherein further comprises the step of:
   repeating the steps of coating, exposing, developing and curing for N (N is integer) times, to form the N kinds of identifiable areas of the printing ink layer.

22. The method according to claim 20, wherein the printing ink layer is coated by a method selected from the group consisting of screening printing, spray coating, curtain coating, and roller coating.

23. The method according to claim 12, wherein the colors of ink are selected from the groups consisting of black, cyan, magenta, yellow, light black, light cyan, light magenta, light yellow, orange, green, light orange and light green.

24. An identifiable flexible print circuit board (PCB), disposed to an inkjet cartridge that contains N (N is integer) kinds of ink having different colors, the flexible PCB comprising:
   a flexible substrate having a first surface;
   a conductive trace formed over the first surface of the flexible substrate; and
   a printing ink layer, formed on the first surface and bared parts of the conductive trace, and N (N is integer) kinds of identifiable areas formed at the printing ink layer, wherein the colors of the identifiable areas are associated with the colors of ink.

25. The flexible PCB according to claim 24, wherein the colors of the identifiable areas are presented by adding N (N is integer) kinds of colorants to the printing ink layer.

26. The flexible PCB according to claim 24, wherein N equals 1.

27. The flexible PCB according to claim 24, wherein N equals 3.

28. The flexible PCB according to claim 24, wherein the material of the printing ink layer is a liquid photo imagerable polymer.

29. The flexible PCB according to claim 28, wherein the liquid photo imagerable polymer is solder mask.

30. The flexible PCB according to claim 28, wherein the liquid photo imagerable polymer is polyimide (PI).

31. The flexible PCB according to claim 24, wherein the printing ink layer is formed on the first surface of the flexible substrate by the steps of coating, exposing, developing and curing.

32. The flexible PCB according to claim 31, wherein the printing ink layer is coated by a method selected from the groups consisting of screening printing, spray coating, curtain coating, and roller coating.

33. The flexible PCB according to claim 24, wherein the material of the flexible substrate comprises at least one of polyimide (PI), Teflon, polyamide, polymethylmethacrylate, polycarbonate, polyester, and polyamide polyethyleneterephthalate copolymer.

* * * * *